(12) United States Patent
Theeuwen

(10) Patent No.: US 8,502,311 B2
(45) Date of Patent: Aug. 6, 2013

(54) SEMICONDUCTOR TRANSISTOR COMPRISING TWO ELECTRICALLY CONDUCTIVE SHIELD ELEMENTS

(75) Inventor: Stephan Jo Cecile Henri Theeuwen, Nijmegen (NL)

(73) Assignee: NXP B.V., Eindhoven (NL)

( * ) Notice: Subject to any disclaimer, the term of this patent is extended or adjusted under 35 U.S.C. 154(b) by 164 days.

(21) Appl. No.: 13/093,091

(22) Filed: Apr. 25, 2011

(65) Prior Publication Data
US 2011/0266619 A1    Nov. 3, 2011

(30) Foreign Application Priority Data
Apr. 29, 2010   (EP) ..................................... 10161399

(51) Int. Cl.
*H01L 29/66* (2006.01)
(52) U.S. Cl.
USPC ........... 257/340; 257/409; 257/435; 257/508; 257/630; 257/660; 257/E29.255
(58) Field of Classification Search
USPC ............. 257/340, 409, 435, 508, 630, 660, 257/E29.255
See application file for complete search history.

(56) References Cited

U.S. PATENT DOCUMENTS

| | | | |
|---|---|---|---|
| 5,918,137 A | 6/1999 | Ng et al. | |
| 6,744,117 B2 | 6/2004 | Dragon et al. | |
| 6,870,219 B2 * | 3/2005 | Brech | 257/340 |
| 7,501,669 B2 | 3/2009 | Parikh et al. | |
| 7,550,783 B2 | 6/2009 | Wu et al. | |
| 7,576,387 B2 | 8/2009 | Theeuwen et al. | |
| 2001/0046011 A1* | 11/2001 | Yasukawa | 349/113 |
| 2005/0156234 A1* | 7/2005 | Gammel et al. | 257/335 |
| 2007/0007591 A1 | 1/2007 | Theeuwen et al. | |
| 2008/0308862 A1 | 12/2008 | Theeuwen et al. | |
| 2011/0073946 A1 | 3/2011 | Theeuwen et al. | |

FOREIGN PATENT DOCUMENTS

| | | |
|---|---|---|
| CN | 1672263 A | 9/2005 |
| WO | 98/53505 A2 | 11/1998 |
| WO | 03/075354 A1 | 9/2003 |
| WO | 2004/012270 A2 | 2/2004 |
| WO | 2007/069188 A2 | 6/2007 |
| WO | 2010/016008 A1 | 2/2010 |

OTHER PUBLICATIONS

Brech, H., et al "Record Efficiency and Gain at 2.1 GHz of High Power RF Transistors for Cellular and 3G Base Stations," IEEE IEDM'03 Technical Digest, pp. 15.1.1-15.1.4, (Dec. 2003).

(Continued)

*Primary Examiner* — Tan N Tran

(57) ABSTRACT

It is disclosed a semiconductor transistor, comprising a semiconductor substrate (111) in which a channel region (115) and a drain extension region (119) connected to the channel region are provided; a gate electrode (127) configured to provide an electric field for influencing the channel region; a first electrically conductive shield element (131) extending in a horizontal direction (103) parallel to a main surface of the semiconductor substrate and being arranged beside the gate electrode spaced apart from the drain extension region in a vertical direction (105) perpendicular to the horizontal direction; and a second electrically conductive shield element (133) arranged spaced apart from the first shield element in the vertical direction, wherein the gate electrode protrudes over the first shield element in the vertical direction.

15 Claims, 13 Drawing Sheets

(56) References Cited

OTHER PUBLICATIONS

Burger, W., et al. "RF-LDMOS:A Device Technology for High Power RF Infrastructure Applications," 2004 IEEE CSIC Digest, pp. 189-192 (Oct. 2004).

Rijs van, F., et al. "Efficiency Improvement of LDMOS Transistors for Base Stations: Towards the Theoretical Limit," Int'l. Electron Devices Meeting, IEDM2006, 4 pgs (2006).

Theeuwen, S.J.C.H., et al. "High Voltage RF LDMOS Technology for Broadcast Applications," Proc. 3rd Eur. Microwave Week Conf., pp. 24-27 (Oct. 2008).

Extended European Search Report for counterpart European Patent Application No. 10161399.0 (Oct. 6, 2010).

* cited by examiner

SEMICONDUCTOR TRANSISTOR COMPRISING TWO ELECTRICALLY CONDUCTIVE SHIELD ELEMENTS

CROSS-REFERENCE TO RELATED APPLICATIONS

This application claims the priority under 35 U.S.C. §119 of European patent application no. 10161399.0, filed on Apr. 29, 2010, the contents of which are incorporated by reference herein.

FIELD OF THE INVENTION

The present invention relates to a semiconductor transistor, in particular to a laterally diffused metal oxide semiconductor (LDMOS) transistor comprising at least two electrically conductive shield elements arranged adjacent to or in a vicinity of a gate electrode. In particular, the present invention relates to a semiconductor transistor, in particular a LDMOS transistor, having reduced input capacitance, reduced feedback capacitance and also improved reliability compared to a conventional semiconductor transistor.

BACKGROUND OF THE INVENTION

From WO 03/075354 A1 a semiconductor device comprising a gate, a source and a drain is known, wherein a first ground shield and a second ground shield are provided for reducing a parasitic capacitance. However, the semiconductor device disclosed by WO 03/075354 may have an increased input capacity, while a parasitic capacitance between the drain and the gate may be reduced.

U.S. Pat. No. 5,918,137 discloses a MOS transistor with a shield electrode coplanar with a gate electrode, wherein the shield electrode is placed on the gate oxide, wherein the gate-drain capacitance is reduced and also hot electron related reliability hazard is reduced. However, the input capacitance of the MOS transistor may be adversely affected.

US 2007/0007591 A1 discloses a LDMOS transistor having a stepped shield structure for shielding the gate of the transistor.

There may be a need for a semiconductor transistor having improved properties and higher reliability compared to a conventional semiconductor transistor. Further, there may be a need for a semiconductor transistor, in particular a LDMOS transistor, having higher reliability, reduced feedback capacitance and at the same time reduced input capacitance compared to conventional semiconductor transistors.

OBJECT AND SUMMARY OF THE INVENTION

According to an embodiment a semiconductor transistor is provided, comprising a semiconductor substrate in which a channel region and a drain extension region connected to the channel region are provided; a gate electrode configured to provide an electric field for influencing the channel region; a first electrically conductive shield element extending in a horizontal direction parallel to a main surface of the semiconductor substrate and being arranged beside the gate electrode spaced apart from the drain extension region in a vertical direction perpendicular to the horizontal direction; and a second electrically conductive shield element arranged spaced apart from the first shield element in the vertical direction, wherein the gate electrode protrudes over the first shield element in the vertical direction.

The semiconductor substrate may comprise a semiconductor material, such as Si, Ga, GaAs, GaN, Ge, SiC, SiGe, InN, InP, GaP, AlGaN or the like. The semiconductor substrate may comprise regions which are doped with elements from group III, IV or/and V. The channel region may for example be doped n-type or p-type, whereas the drain extension region may for example be doped p-type or n-type (thus being doped in a type different from the channel region). The channel region may be adjacent to the drain extension region within the semiconductor substrate. A charge distribution of the channel region may be controlled by applying an electric voltage at the gate electrode which may in particular be located in a vicinity of the channel region. According to an embodiment an oxide layer separates the gate electrode from the channel region. Thereby, a MOSFET may be formed according to an embodiment.

In other embodiments, the channel region may comprise two materials with different band gaps thereby incorporating a junction between the two materials. According to an embodiment the semiconductor transistor is a high electron mobility transistor (HEMT), wherein high mobility electrons are generated using a heterojunction of a highly doped wide band gap n-type donor supply layer and a non-doped narrow band gap channel layer with no dopant impurities. In this case, there may be no oxide layer between the gate electrode and the channel region.

The semiconductor transistor may for example be employed in base stations or mobile telephones for personal communication systems (GSM, W-CDMA), in particular in radio frequency (RF) power amplifiers of such systems. The RF signals to be amplified by the power amplifier may have a frequency in a range from 450-2200 MHz.

The gate electrode may comprise a metal such as tungsten (W) or may comprise silicided polysilicon. The channel region may comprise a laterally diffused p-type region. In particular, this region may be adjacent to a source region comprised in the semiconductor substrate, wherein the source region is connected to a source electrode.

The drain extension region (according to an embodiment configured as an n-type drain extension region, thus being doped n-type) may enable high voltage operation of the semiconductor transistor. The drain extension region may extend 1 μm-5 μm parallel to the main surface of the semiconductor substrate. The drain extension region may on one end be connected to the channel region and on the other end may be connected to a drain contact region comprised in the semiconductor substrate, wherein the drain contact region may be connected to a drain electrode of the semiconductor transistor. Thereby, the drain extension region may have a lower doping level than the drain contact region. In particular, the drain contact region may have a similar doping level as the source contact region comprised in the semiconductor substrate. According to an embodiment both the source contact region and the drain contact region are n-type doped.

The first electrically conductive shield as well as the second electrically conductive shield may comprise a metal, in particular W, Al, Cu and/or may comprise silicide or highly doped silicon. The first electrically conductive shield element and the second electrically conductive shield element may be formed or manufactured using photolithography by applying a mask onto the semiconductor substrate, exposing the semiconductor substrate provided with the mask by electromagnetic radiation, developing the semiconductor substrate, etching or depositing materials from or onto the semiconductor substrate. Thereby, complex three-dimensional structures may be formed for establishing the first electrically conductive shield and the second electrically conductive shield.

The main surface of the semiconductor substrate may be considered as a surface of maximal extent of the semiconductor substrate at which the channel region and the drain extension region are formed side by side. Thereby, a horizontal direction may be defined to lie within the main surface of the semiconductor substrate. In case of a MOSFET, in particular a LDMOS, an oxide layer may be present parallel to the main surface of the semiconductor substrate.

According to an embodiment the first electrically conductive shield element and/or the second electrically conductive shield element are connected to a source electrode of the semiconductor transistor, which in particular may be connected to a ground or earth potential. Thereby, the first electrically conductive shield element and the second electrically conductive shield element may shield an electric field between in particular the gate and the drain extension region and/or drain contact region and/or drain electrode. In particular, the first electrically conductive shield element may be arranged beside the gate electrode to bend or repel electric field lines away from sensitive portions of the semiconductor transistor, such as from an oxide layer between the gate electrode and the drain extension region. In particular, during operation of the semiconductor transistor a high electric field may be present within the drain extension region which may accelerate charge carriers, such as electrons, towards an oxide layer vertically above the drain extension region. Thereby, the first electrically conductive shield element may reduce so-called "hot carrier injection" or "hot carrier degradation" of the oxide layer. Thereby, the reliability of the semiconductor transistor may be improved.

Thereby, it may be advantageous that the first electrically conductive shield element has a small extent in the vertical direction such that the gate electrode has a larger vertical extent than the first electrically conductive shield element. Otherwise, the first electrically conductive shield element might contribute to a capacitance (input capacitance) between the gate electrode and the source electrode to which the first electrically conductive shield element is electrically connected according to an embodiment. On the other hand, it may be advantageous to place the first electrically conductive shield element as close as possible in the horizontal direction towards the gate electrode, in order to effectively reduce hot carrier injection events. According to an embodiment the first electrically conductive shield element is shaped, configured and arranged such that hot carrier injection is reduced without considerably contributing to an increase of the input capacitance (capacitance between the source electrode and the gate electrode).

According to an embodiment the second electrically conductive shield element is arranged farther away from the drain extension region in the vertical direction than the first electrically conductive shield element. Thereby, a contribution of the second electrically conductive shield element to the capacitance between the gate electrode and the source electrode (input capacitance) may be reduced, since the capacitance may be at least approximately inversely proportional to a distance between the second electrically conductive shield element and the gate electrode. Further according to an embodiment the second electrically conductive shield element is spaced apart from the gate electrode in a horizontal direction as well as in the vertical direction farther than the first electrically conductive shield element in the horizontal direction. According to an embodiment the second electrically conductive shield element shields the gate electrode from the drain electrode such that the feedback capacitance (capacitance between the gate electrode and the drain electrode) is reduced without considerably increasing the input capacitance.

According to an embodiment the shaping, adaptation and arrangement of the first electrically conductive shield element and the second electrically conductive shield element are such that two purposes and functions, i.e. hot carrier injection reduction and feedback capacitance reduction, are achieved. At the same time the input capacitance is decreased (or at least not considerably increased), in order to increase the gain of the semiconductor transistor. This may in particular be achieved in that the first electrically conductive shield element does not comprise a vertical portion extending in the vertical direction.

According to an embodiment the gate electrode protrudes over the first shield element in the vertical direction by more than 1.1, in particular more than 1.5, times an extent of the first shield element in the vertical direction.

The more the gate electrode protrudes over the first shield element in the vertical direction the less the first electrically conductive shield element may contribute to the input capacitance of the semiconductor transistor. Thereby, the input capacitance of the semiconductor transistor may be maintained while at the same time the hot carrier injection may be reduced by providing the first electrically conductive shield element.

According to an embodiment a distance between the first shield element and the gate electrode in the horizontal direction is smaller than 0.3 µm, in particular smaller than 0.2 µm, in particular smaller than 0.1 µm. In particular, it may be advantageous to arrange the first shield element as close as possible in the horizontal direction to the gate electrode, in particular to a side edge of the gate electrode. Thereby, in particular electric field lines concentrating or focusing at an edge or a corner of the gate electrode may advantageously be bent away or repelled from an oxide layer between the gate electrode and the channel region and/or the drain extension region. Thereby, hot carrier injection may even further be reduced.

According to an embodiment a distance between the first shield element and the drain extension region in the vertical direction is between 50 nm and 200 nm, in particular between 75 nm and 125 nm. The closer the first electrically conductive shield element is to the drain extension region in the vertical direction the more effectively electric field lines may be bent away or repelled from the oxide layer. However, also an oxide layer may require a particular thickness in order to effectively isolate the gate electrode from the semiconductor substrate, in particular from the channel region and the drain extension region.

According to an embodiment a distance between an upper surface of the first shield element and a lower surface portion of the second shield element is between 200 nm and 500 nm, in particular between 300 nm and 400 nm. The greater the distance in the vertical direction between the first electrically conductive shield element and the second electrically conductive shield element the higher also the vertical distance between the gate electrode and the second electrically conductive shield element may be. Thereby, the input capacitance of the semiconductor transistor may be increased only to an acceptable extent, while the feedback capacitance is effectively reduced owing to the shield effect of the second electrically conductive shield element.

According to an embodiment the second shield element includes a lower horizontal portion of the second shield element extending in the horizontal direction, a vertical portion of the second shield element extending in the vertical direction, an end of the vertical portion being connected to the lower horizontal portion of the second shield element, and an upper horizontal portion of the second shield element extending in the horizontal direction and being connected to another end of the vertical portion of the second shield element, wherein a (vertical) distance between an upper surface of the gate electrode and a lower surface of the upper horizontal portion of the second shield element is between 200 nm and 500 nm, in particular between 300 nm and 400 nm.

This particular construction of the second electrically conductive shield element composed of a lower horizontal portion, a vertical portion and an upper horizontal portion may enable effectively shielding the gate electrode from the drain electrode, in particular enable at least partly surrounding the gate electrode. Further, it may enable to maintain a distance in the vertical direction which is large enough in order not to increase the input capacitance above a non-acceptable amount. Thereby, the feedback capacitance of the semiconductor transistor may effectively be reduced, while the input capacitance remains at an acceptable level.

According to an embodiment a distance between an edge of the first shield element closest to the gate electrode and an edge of the vertical portion of the second shield element closest to the gate electrode is between 200 nm and 500 nm, in particular between 300 nm and 400 nm. Thereby, concurrently, a distance of the vertical portion of the second electrically conductive shield element and the gate electrode may be sufficiently large such as not to increase the input capacitance above a threshold. In spite of that the feedback capacitance may be reduced.

According to an embodiment the second shield element surrounds an upper surface of the gate electrode. In particular, in a projection view along the vertical direction the second electrically conductive shield element may cover the gate electrode. Further, the second shield element may have a larger extent in the horizontal direction than an extent of the gate electrode in the horizontal direction. Thereby, the feedback capacitance may even further be reduced.

According to an embodiment the second shield element comprises a stair case shield partly protruding in the horizontal direction over a side edge of the first shield element farthest from the gate electrode. A stair case shield may comprise one or more horizontal portions and one or more vertical portions which may be connected to each other to form the second shield element. In particular, a horizontal portion may be followed by a vertical portion to form a repeated pattern. In particular, the second electrically conductive shield element may have a similar shape and function as the stepped shield structure disclosed in US 2007/0007591 A1, which is incorporated herewith by reference.

According to an embodiment the semiconductor transistor further comprises a further first shield element which is electrically conductive and which extends in the horizontal direction and is arranged vertically between the first shield element and the second shield element, wherein the further first shield element is spaced apart (in particular in the horizontal direction) farther from the gate electrode than the first shield element. Thereby, the further first shield element may further reduce the input capacitance.

According to an embodiment the semiconductor transistor further comprises a source region provided in the semiconductor substrate and connected to the channel region and a source electrode connected to the source region, wherein at least one of the first shield element, the further first shield element and the second field element is connected to the source electrode.

Based on a voltage applied to the gate electrode the semiconductor transistor may form a conductive path between the source region and the drain extension region such that a current may flow from the source region to the drain extension region. Since the source region is connected to the source electrode and the drain extension region may be connected via a drain contact region to a drain electrode, a current may flow from the source electrode to the drain electrode. This current may represent an amplified signal in correspondence with the voltage applied to the gate electrode. In particular, the source electrode may be connected to a ground or earth potential. Thereby, the first shield element, the further first shield element and/or the second shield element may appropriately function as electric field shielding elements.

According to an embodiment the semiconductor substrate comprises at least one of Si, GaN, GaAs, AlGaN, SiC and AlN.

According to an embodiment the semiconductor transistor further comprises an oxide layer arranged on the channel region and on the drain extension region and arranged below the gate electrode and below the first shield element. Thereby, in particular a MOSFET may be provided. The electric field generated by the gate electrode, when a voltage is applied to the gate electrode, may reach through the oxide layer into the channel region to influence a charge distribution within the channel region. At the same time the gate electrode may be electrically isolated from the channel region and/or the drain extension region and/or the source region.

According to an embodiment the semiconductor transistor is configured as LDMOS (laterally diffused metal-oxide-semiconductor).

According to an embodiment a method for manufacturing a semiconductor transistor is provided, wherein the method comprises forming a semiconductor substrate having a channel region and a drain extension region connected to the channel region; arranging and configuring a gate electrode to provide an electric field for influencing the channel region; arranging a first electrically conductive shield element extending in a horizontal direction parallel to a main surface of the semiconductor substrate beside the gate electrode and arranging the first electrically conductive shield element spaced apart from the drain extension region in a vertical direction perpendicular to the horizontal direction; arranging a second electrically conductive shield element spaced apart from the first shield element in the vertical direction, wherein the gate electrode protrudes over the first shield element in the vertical direction.

It has to be noted that embodiments of the invention have been described with reference to different subject matters. In particular, some embodiments have been described with reference to method type claims, whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims, and features of the apparatus type claims, is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment, but to which the invention is not limited.

BRIEF DESCRIPTION OF THE DRAWINGS

The invention will be described in more detail hereinafter with reference to examples of embodiment but to which the invention is not limited. Thereby, elements, components and/or method steps similar in structure and/or function are denoted by reference signs differing only in the first position. As far as an element, a component, or a method step is not described in detail with respect to a particular embodiment the description of the corresponding element, component, or method step with respect to another embodiment may serve as an auxiliary description for this element, component, or method step in the particular embodiment.

DESCRIPTION OF EMBODIMENTS

Figure 1A:
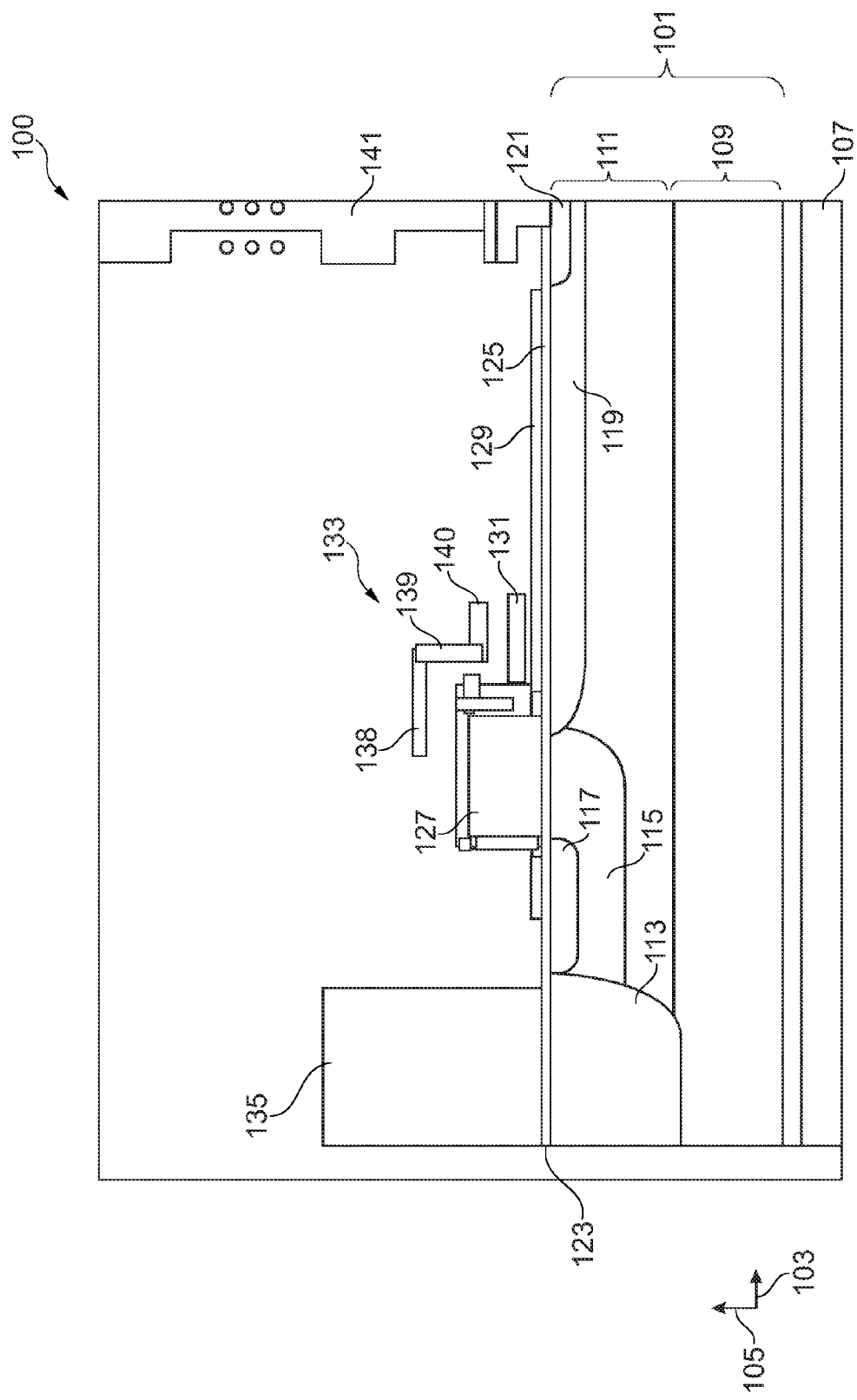
FIG. 1A is a cross-sectional view of a schematic illustration of a semiconductor transistor according to an embodiment.

The illustration in the drawing is schematically. In different drawings, similar or identical elements are provided with similar or identical reference signs.

FIG. 1A is a cross-sectional view of a semiconductor transistor (in particular a LDMOS) according to an embodiment. Compared to a conventional semiconductor transistor the LDMOS 100 illustrated in FIG. 1A provides a reduction of the input capacitance, reduction of the feedback capacitance, increase of transistor gain and maintaining degradation reliability.

The LDMOS 100 comprises a substrate 101 which is comprised of a semiconductor material, in this case p-type silicon. The substrate 101 extends in a horizontal direction 103 (parallel to a main surface of the substrate 101) and a vertical direction 105. The substrate 101 is terminated by a source backside metallization 107. The substrate 101 comprises a highly p-type doped region 109 and an epitaxial substrate region 111 (p-type doped), wherein a P-sinker region 113, a P-well or channel region 115, a source contact region 117, a drain extension region 119, a drain contact region 121 are arranged. The source contact region 117 as well as the drain contact region 121 are both highly n-type doped. The drain extension region 119 is also n-type doped but has a lower doping level than the drain contact region 121. The P-well region 115 forms a channel region connecting the drain extension region 119 with the source contact region 117. The channel region 115 is in the illustrated example a laterally diffused p-type doped region surrounding the source region 117. The P-sinker region 113 connects the source region 117 with the substrate region 109. The source region 117 and the P-sinker region 113 are connected to an interconnect layer 123.

Above part of the source region 117, the channel region 115, the drain extension region 119 and the drain contact region 121 an oxide layer 125 (for example $SiO_2$) is arranged primarily extending parallel to the main surface of the substrate 101 and thus extending in the horizontal direction 103. In a horizontal position approximately above the channel region 115 a gate electrode 127 is arranged on top of the oxide layer 125. Thereby, the gate (for example comprising a metal and/or polysilicon) is electrically isolated from the channel region 115. Nevertheless, a voltage applied at the gate electrode 127 causes an electric field penetrating the oxide layer 125 and reaching into the channel region 115 to effect a carrier distribution within the channel region 115. By applying for example a positive voltage at the gate electrode 127 an electrically conductive path is established from the source region 117 via the channel region 115 to the drain extension region 119.

Figure 2:
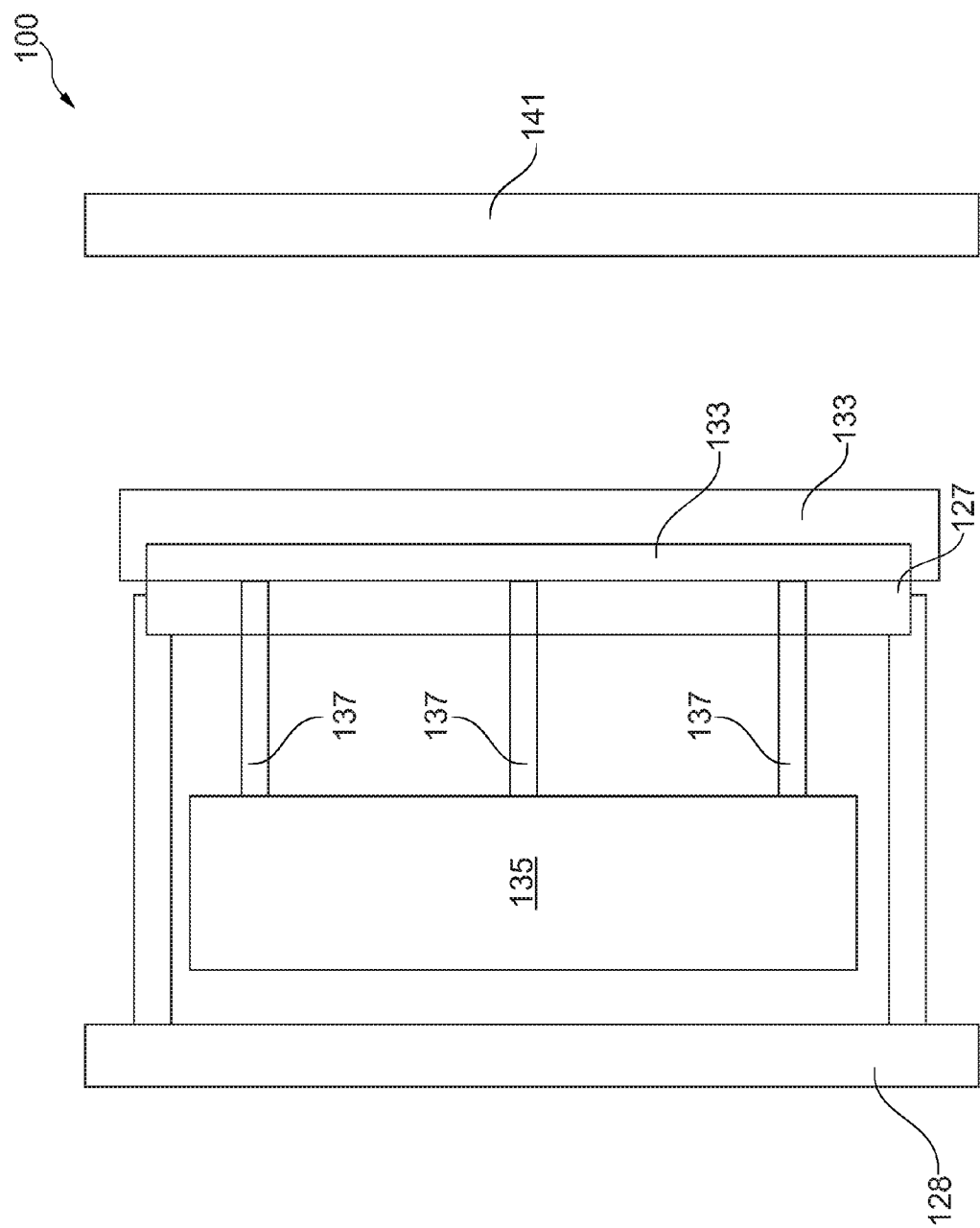
FIG. 2 is a top view of the semiconductor transistor illustrated in FIG. 1A.

A plasma oxide layer 129 is provided on top of the oxide layer 125. On top of this plasma oxide layer 129 and beside the gate electrode 127 a first electrically conductive shield element 131 is arranged which primarily extends in the horizontal direction 103 and to a smaller extent in the vertical direction 105. The first electrically conductive shield element 131 functions so as to reduce hot carrier injection of electrical carriers, such as electrons, from the drain extension region 119 into the oxide layer 125. In particular, the first electrically conductive shield element 131 is connected to a ground or earth potential. In particular the first electrically conductive shield element as well as the second electrically conductive shield element 133 are both connected to the source electrode 135 which is connected to the source region 117. Connection between the source 115 and the shield elements 133 and 131 is for example provided by shield connect bridges 137 as depicted in FIG. 2 showing a top view of the LDMOS 100.

The LDMOS 100 illustrated in FIG. 1A further comprises a second electrically conductive shield element 133 provided vertically above the first electrically conductive shield element 131 and comprising a first horizontal portion 138, a vertical portion 139 and a second horizontal portion 140 being connected to each other, as illustrated in FIG. 1A. The second electrically conductive shield element 133 provides a shielding of electric field lines between the gate electrode 127 and a drain electrode 141 which is connected to the drain contact region 121.

Figure 1B:
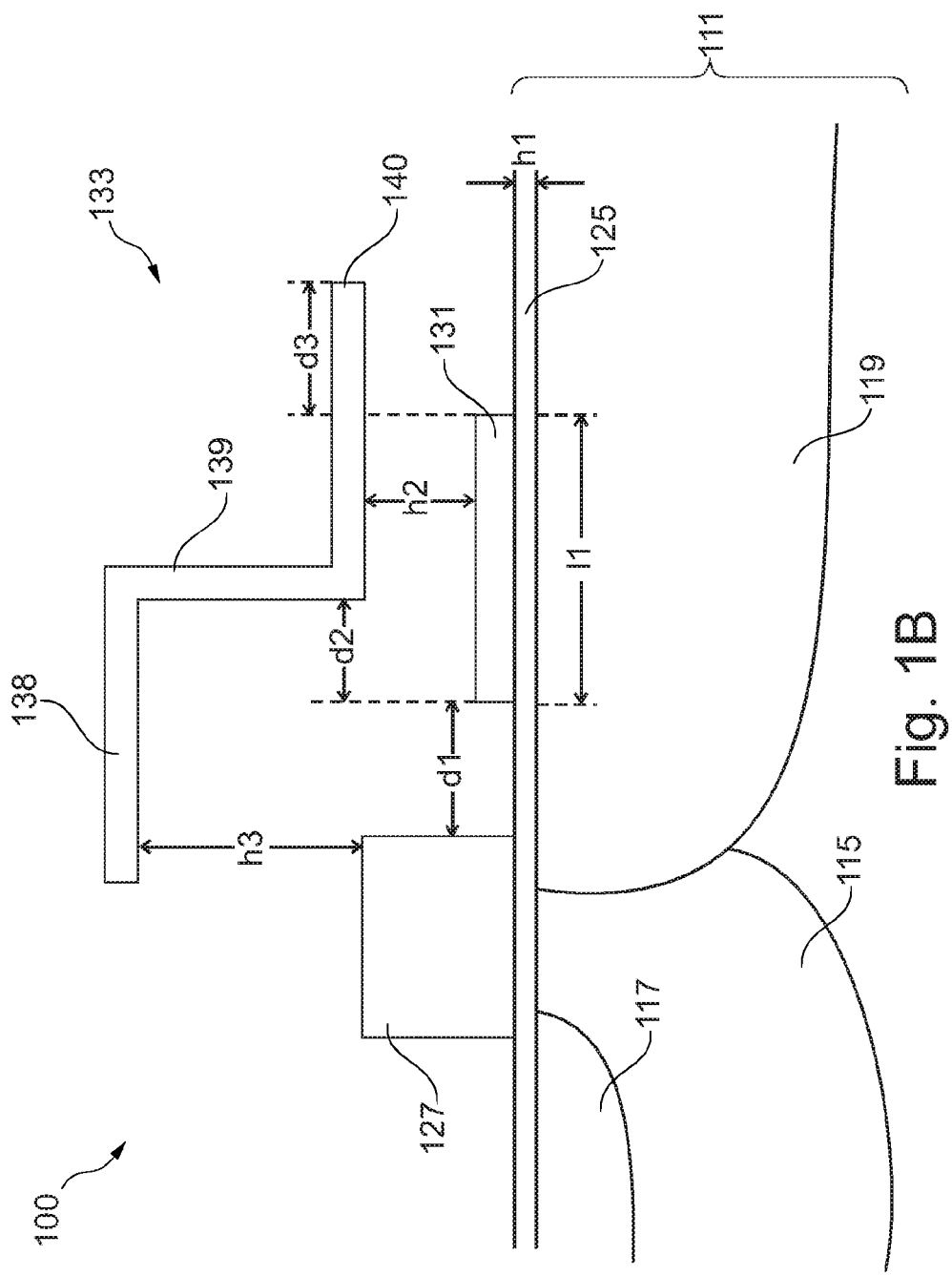
FIG. 1B is a cross-sectional view of a portion of the semiconductor transistor illustrated in FIG. 1A.

Now turning to FIG. 1B a more detailed explanation of the geometry and relative positioning of the first electrically conductive shield element 131 and the second electrically conductive shield element 133 of the LDMOS 100 illustrated in FIG. 1A are explained. The first electrically conductive shield element 131 is arranged a distance h1 above the drain extension region 119. h1 may amount to about 75 nm to 125 nm. Thereby, in FIG. 1B, the thickness h1 may represent a sum of thicknesses of the oxide layer 125 and the (not indicated) plasma oxide layer 129. Further, the first electrically conductive shield element 131 has an extent l1 in the horizontal direction 103, wherein l1 may amount to between 200 nm to 1200 nm, in particular 400 nm to 1100 nm, further in particular 1000 nm. Further, the first electrically conductive shield element 131 is spaced apart in the horizontal direction 103 by a distance d1 from an edge of the gate electrode 127, wherein the distance d1 may amount to 0 μm to 0.2 μm, in particular below 0.1 μm. Further, the gate electrode 127 protrudes above the first electrically conductive shield element 131 in the vertical direction 105.

The second electrically conductive shield element 133 comprises a first horizontal portion 138, a vertical portion 139 and a second horizontal portion 140 which are all arranged vertically above the first electrically conductive shield element 131. In particular, the second horizontal portion 140 of the second electrically conductive shield element 133 is spaced apart (arranged above) from a top surface of the first electrically conductive shield element 131 by a distance h2 which may amount to between 200 nm and 500 nm, in particular between 300 nm and 400 nm. Further, the first horizontal portion of the second electrically conductive shield element 133 is spaced apart from a top surface of the gate electrode 127 by a distance h3 which may amount to between 200 nm and 500 nm, in particular between 300 nm and 400 nm. Thereby, the contribution of the second electrically conductive shield element 133 to an input capacitance (capacitance between the gate electrode 127 and the source electrode 135 illustrated in FIG. 1A) may be limited. Further, an edge of the vertical portion 139 of the second electrically conductive shield element 133 closest to the gate electrode 127 is spaced apart in the horizontal direction 103 by a distance d2 from an edge of the first electrically conductive shield element 131 closest to the gate electrode 127, wherein d2 may amount to between 200 nm and 500 nm, in particular 300 nm to 400 nm.

Figure 3:
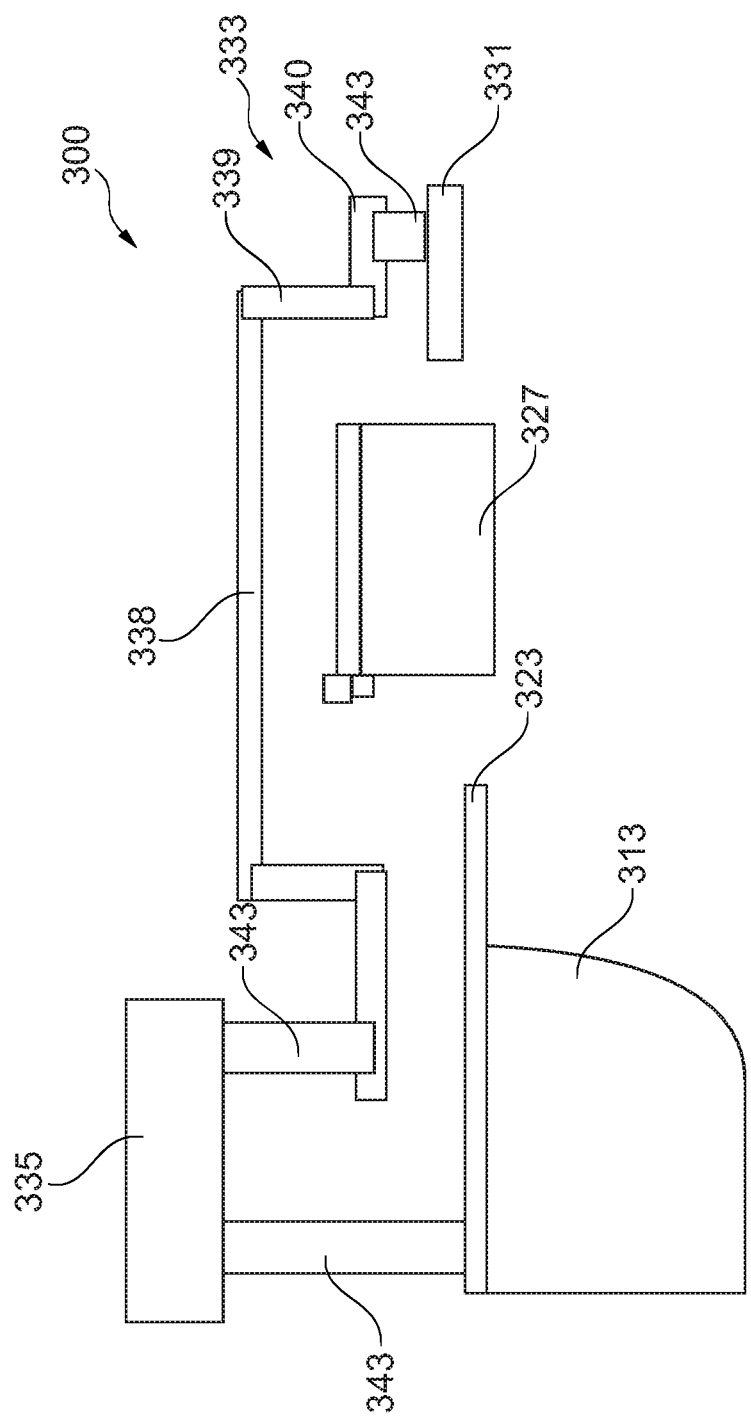
FIG. 3 is a schematic illustration of an embodiment of a semiconductor transistor.

Referring now to FIG. 3 a portion of a sectional view of the LDMOS 100 illustrated in FIG. 1A is illustrated. In the illustration a possible variant of a connection (electrical connection) between the first electrically conductive shield element 131 and the second electrically conductive shield element 133 is illustrated, wherein the connection is established by a contact via 343.

According to the embodiment illustrated in FIG. 1A the electric field at an edge of the gate electrode 127 is reduced by the first electrically conductive shield element 131 thereby diminishing the source-drain current degradation. Further, in particular for radio frequency applications utilizing very high frequencies the second electrically conductive shield element 133 reduces the coupling between drain 141 and gate electrode 127 thereby reducing oscillations and instabilities. In particular, the input capacitance due to the first electrically conductive shield element 131 is not dramatically increased, since the first electrically conductive shield element 131 does not overlap the gate electrode 127 in the horizontal direction. According to an embodiment the epitaxial substrate 111 comprises Si, GaN, GaAs or other semiconductor materials.

In particular, the first electrically conductive shield element does not comprise a vertical portion at the side of the gate electrode 127 nor does it comprise a portion covering a top surface of the gate electrode 127. Further, the second electrically conductive shield element 133 may not have a function as a field plate but may only act as a shielding between the drain 141 and the gate electrode 127. This may be in particular due to the relatively large distance between the second electrically conductive shield element 133 and the drain extension region 119. Further, because of the relatively large distance between the second electrically conductive shield element 133 and the gate electrode 127 only a small impact (increase) on the input capacitance is observed.

Figure 4B:
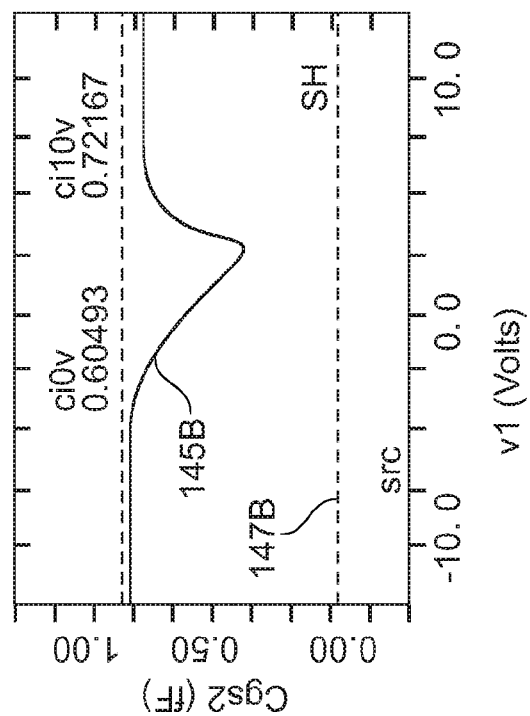
FIGS. 4A and 4B illustrate graphs of an input capacitance of a conventional semiconductor transistor and of the semiconductor transistor according to an embodiment illustrated in FIG. 1A, respectively.
Figure 4A:
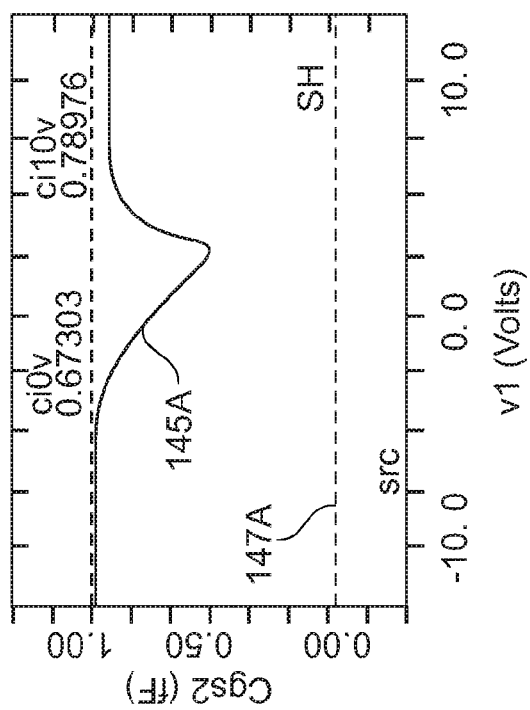

Referring now to FIGS. 4A and 4B the input capacitance of the LDMOS 100 illustrated in FIG. 1A, as illustrated in FIG. 4B, is compared to the input capacitance of a conventional LDMOS, as illustrated in FIG. 4A. A voltage of 0 V is applied at the drain electrode 141 as illustrated in FIG. 1A, whereas the voltage applied to the gate electrode 127 is swept from −10 V to 10 V, as indicated at the abscissa axis in FIGS. 4A and 4B. The input capacitance of the LDMOS 100 is shown as a curve 145B, while a portion of the input capacitance due to the first shield 131 and the second shield 133 is labelled as a curve 147B. The input capacitance of a conventional transistor is shown as a curve 145A, while a portion of the input capacitance due to a conventional shield is labelled as a curve 147A. As can be seen from the graphs in FIGS. 4A and 4B the input capacitance of the LDMOS 100 illustrated in FIG. 1A (as illustrated in FIG. 4B) is smaller than the input capacitance of a conventional LDMOS. Also the contribution of the first shield 131 and the second shield 133 to the capacitance is lower than the contribution of a conventional shield to the capacitance. Thus, the LDMOS 100 illustrated in FIG. 1A exhibits an improved input capacitance (reduced input capacitance) compared to a conventional LDMOS.

Figure 5B:
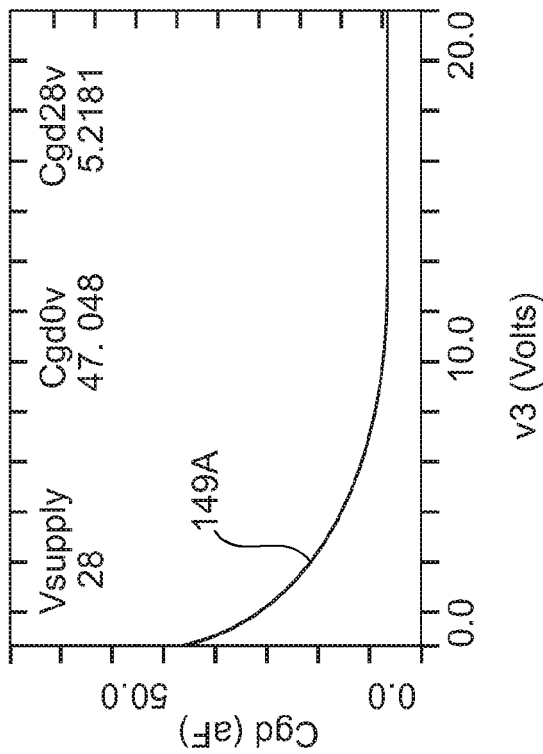
FIGS. 5A and 5B illustrate graphs showing a feedback capacitance of a conventional semiconductor transistor and the semiconductor transistor illustrated in FIG. 1A, respectively.
Figure 5A:
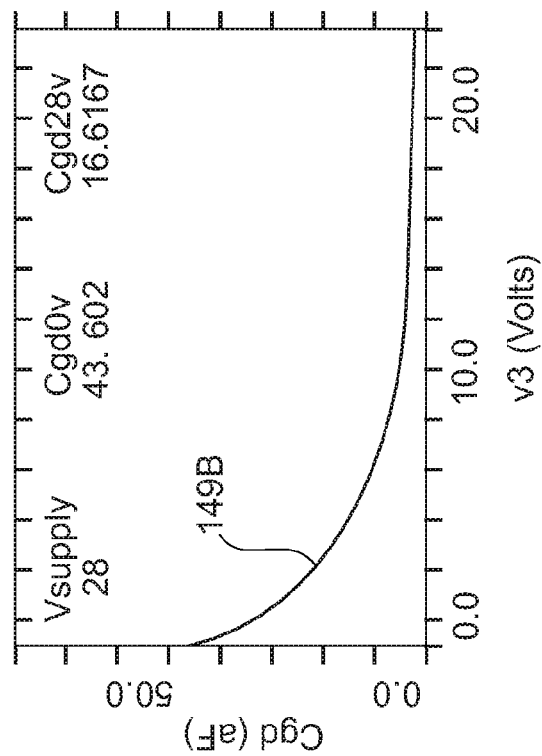

Referring now to FIGS. 5A and 5B a feedback capacitance (capacitance between gate and drain) are illustrated in form of graphs for a conventional LDMOS (see FIG. 5A) and the LDMOS 100 illustrated in FIG. 1A (see FIG. 5B). Applying a voltage of 0 V at the gate electrode 127 the drain voltage applied to the drain 141 is varied from 0 to 28 V, as indicated in the abscissa axis in FIGS. 5A and 5B. The feedback capacitance is shown as a curve 149A and 149B, respectively. As can be observed from FIGS. 5A and 5B the feedback capacitance 149B is smaller for the LDMOS 100 illustrated in FIG. 1A (FIG. 5B) than for the conventional LDMOS (curve 149A in FIG. 5A). Thereby, a performance of the LDMOS 100 is improved.

Figure 6B:
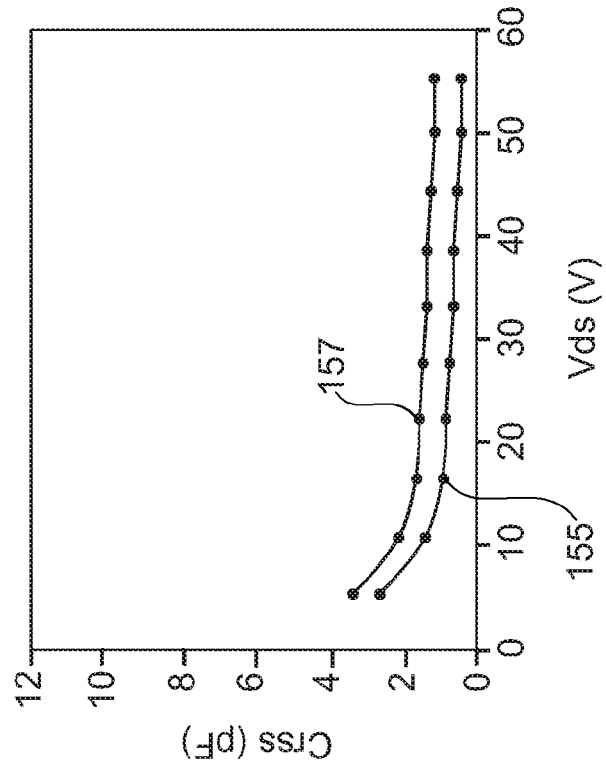
FIG. 6A and FIG. 6B illustrates graphs showing measurements of an input capacitance and a feedback capacitance, respectively, of a semiconductor transistor as illustrated in FIG. 1A and a conventional semiconductor transistor.
Figure 6A:
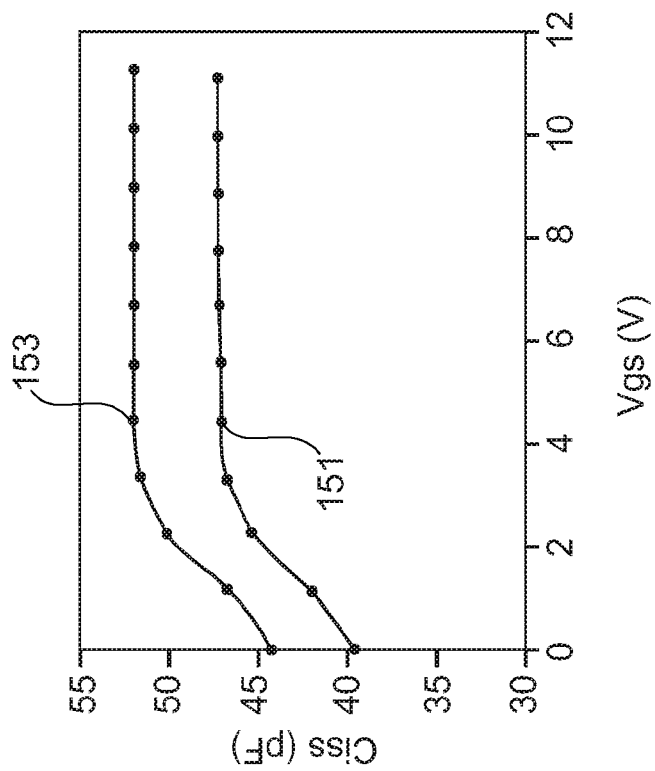

Reverting now to FIGS. 6A and 6B input capacitance (FIG. 6A) and feedback capacitance (FIG. 6B) measurements are presented comparing the performance of the LDMOS 100 illustrated in FIG. 1A and a conventional LDMOS. FIG. 6A illustrates a graph showing the input capacitance Ciss of the LDMOS 100 illustrated in FIG. 1A as curve 151 and the input capacitance of a conventional LDMOS as curve 153. As can be observed, the input capacitance of the LDMOS 100 illustrated in FIG. 1A is reduced by 10% over the whole voltage range.

FIG. 6B illustrates the feedback capacitance of the LDMOS 100 illustrated in FIG. 1A as curve 155 and the feedback capacitance of a conventional LDMOS as a curve 157. As can be observed, the feedback capacitance Crss of the LDMOS 100 illustrated in FIG. 1A is reduced by 40% at the supply voltage, wherein a gain improvement of about 0.5 dB is established for the LDMOS 100 illustrated in FIG. 1A.

Figure 7:
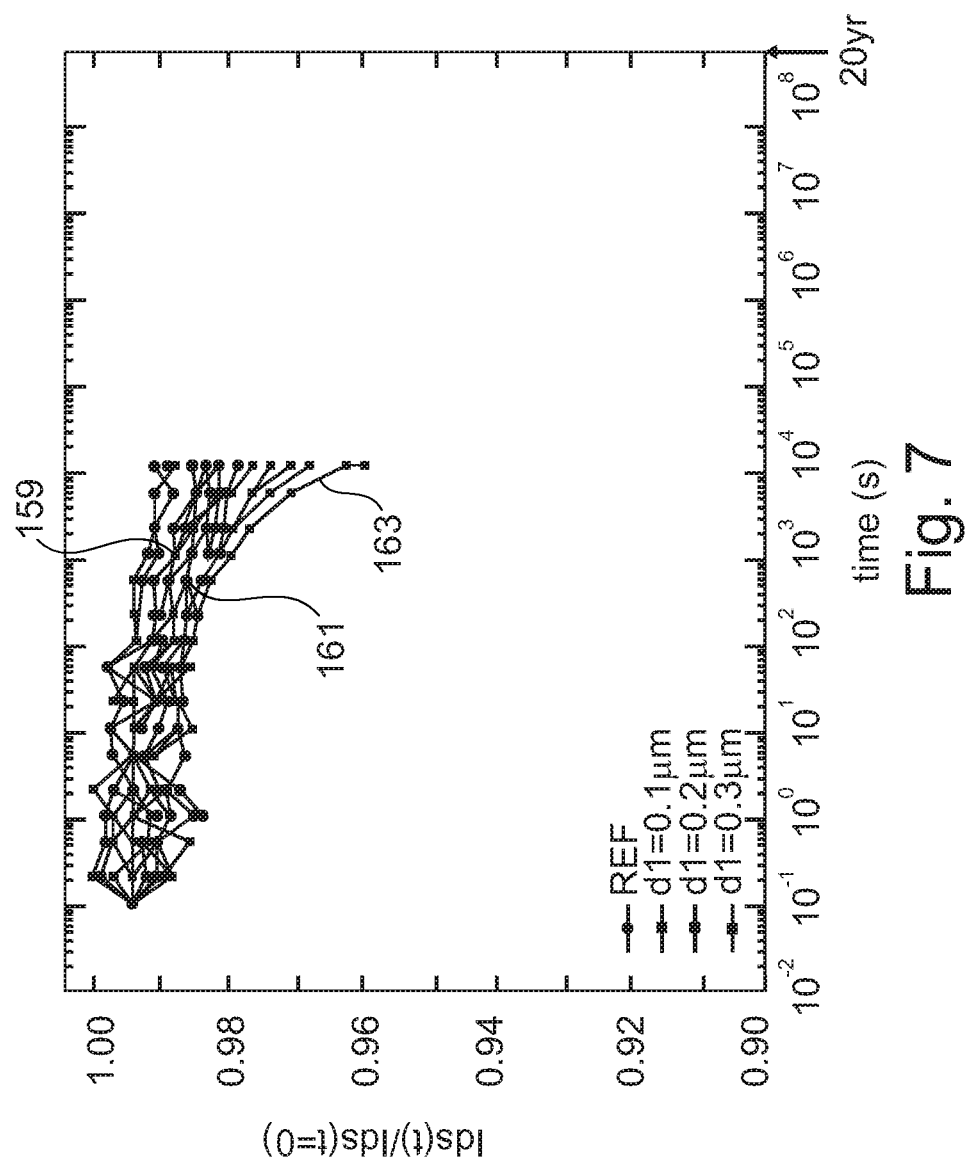
FIG. 7 illustrates a graph showing a drain-source current of the semiconductor transistor illustrated in FIG. 1A and a conventional semiconductor transistor.

Reverting now to FIG. 7 Idq degradation measurements are presented, showing a drain-source current in dependence of time indicated at the abscissa axis. The drain-source current Ids is indicated at the ordinate axis. Thereby different measurements were performed for different distances d1 between the first electrically conductive shield element 131 and the gate electrode 127 ranging from 0.3 μm to 0.1 μm. The curve for the distance d1=0.1 μm is indicated by reference sign 159, for the distance d1=0.2 μm by the reference sign 161 and for the distance d1=0.3 μm by the reference sign 163. It can be observed that the drain-source current degradation is not effected, if the first electrically conductive shield element 131 is placed within a distance of 200 nm from the gate.

Figure 8:
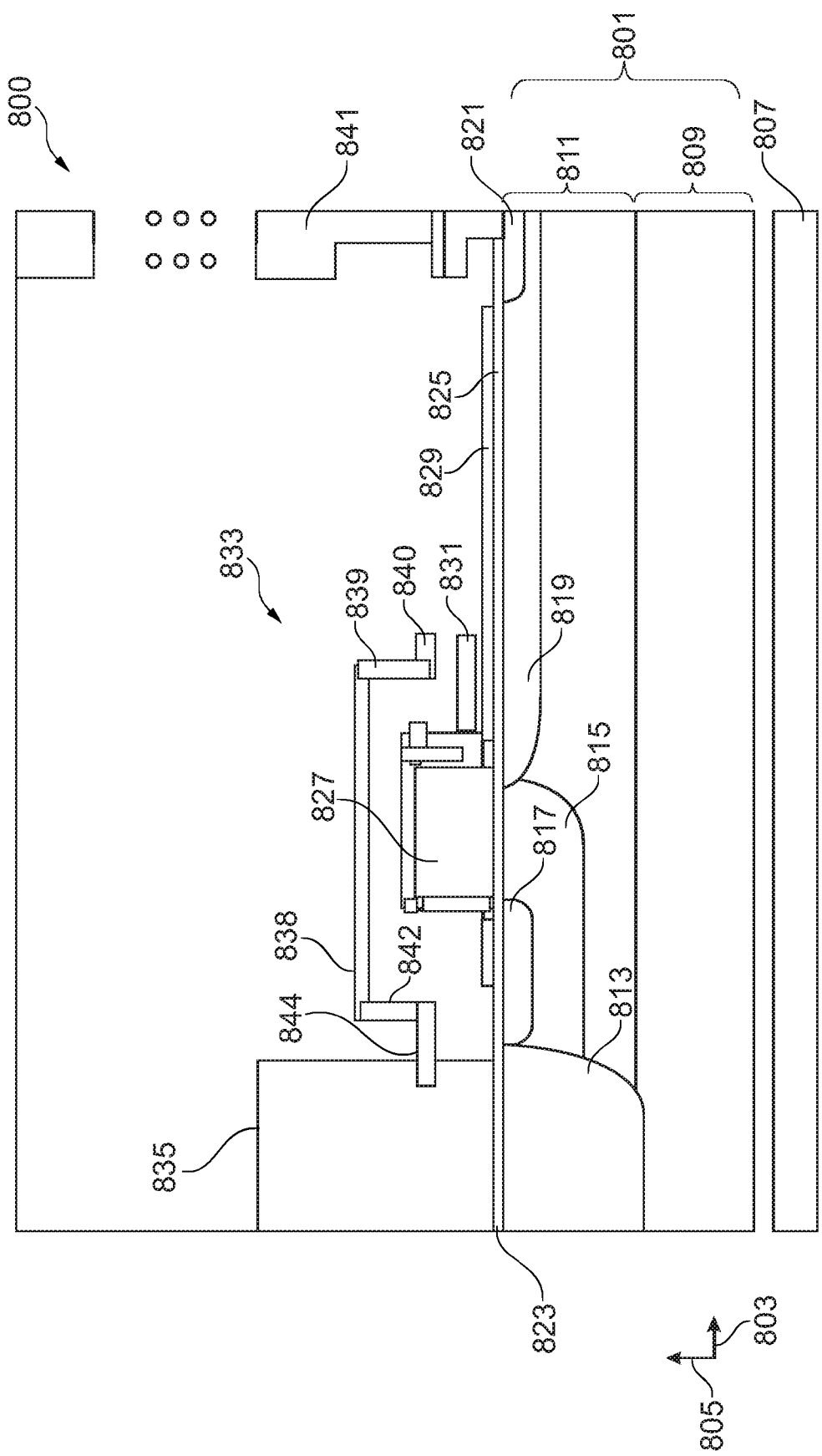
FIG. 8 is a cross-sectional view of another embodiment of a semiconductor transistor.

FIG. 8 illustrates a cross-sectional view of a LDMOS 800 according to an embodiment. Thereby, the second electrically conductive shield element 833 completely covers the gate electrode 827 by providing further portions 842 and 844 such that the feedback capacitance is greatly reduced to very small values.

Figure 9:
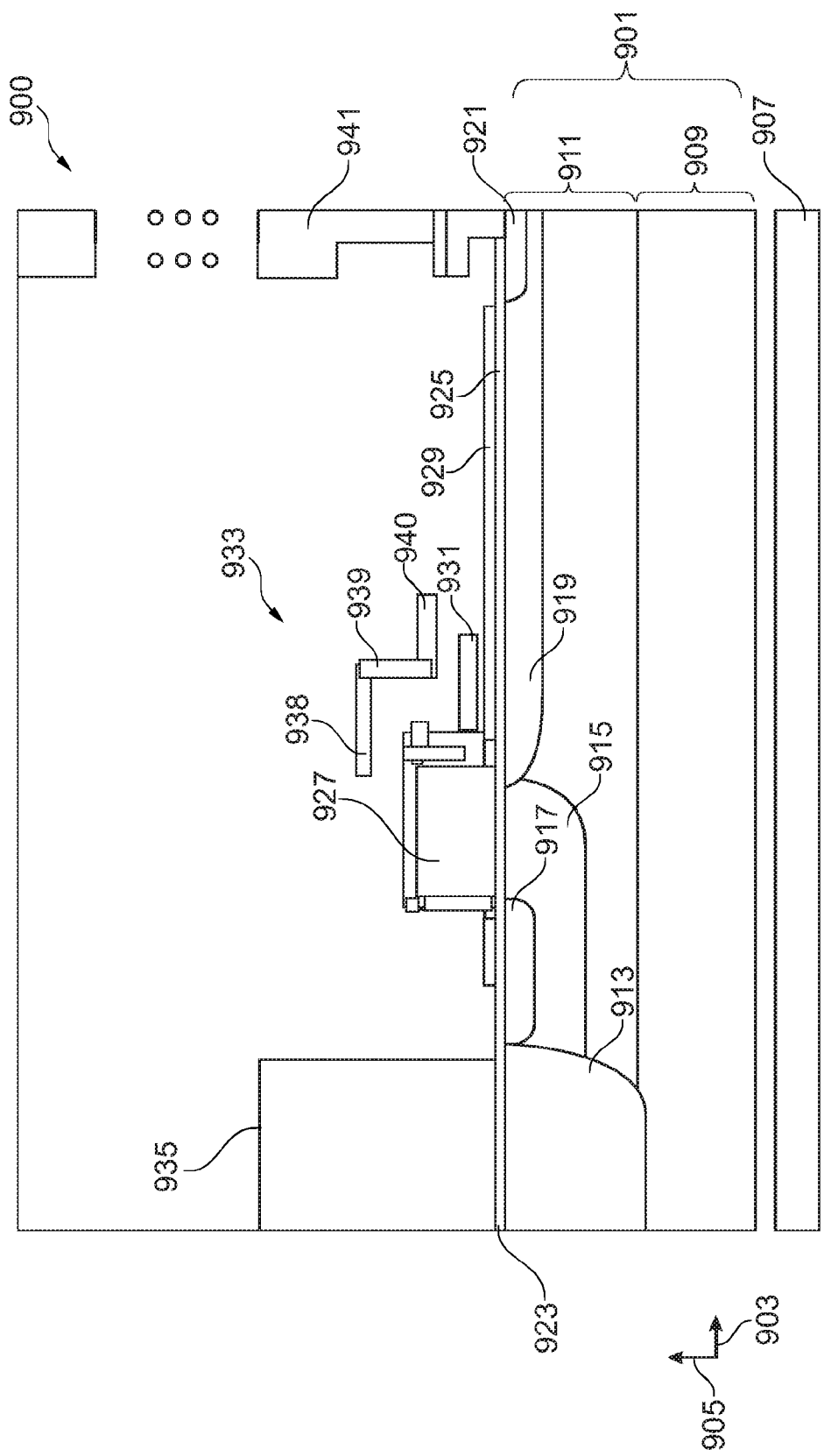
FIG. 9 is a cross-sectional view of a further embodiment of a semiconductor transistor.

FIG. 9 illustrates a cross-sectional view of a LDMOS 900 according to an embodiment. In the illustrated embodiment the lower horizontal portion 940 of the second electrically conductive shield element 933 protrudes in the vertical direction 903 over the first electrically conductive shield element 931. Thereby, the horizontal portion 940 of the second electrically conductive shield element 933 is part of a stair case shield, thereby improving the reliability of the LDMOS 900.

Figure 10:
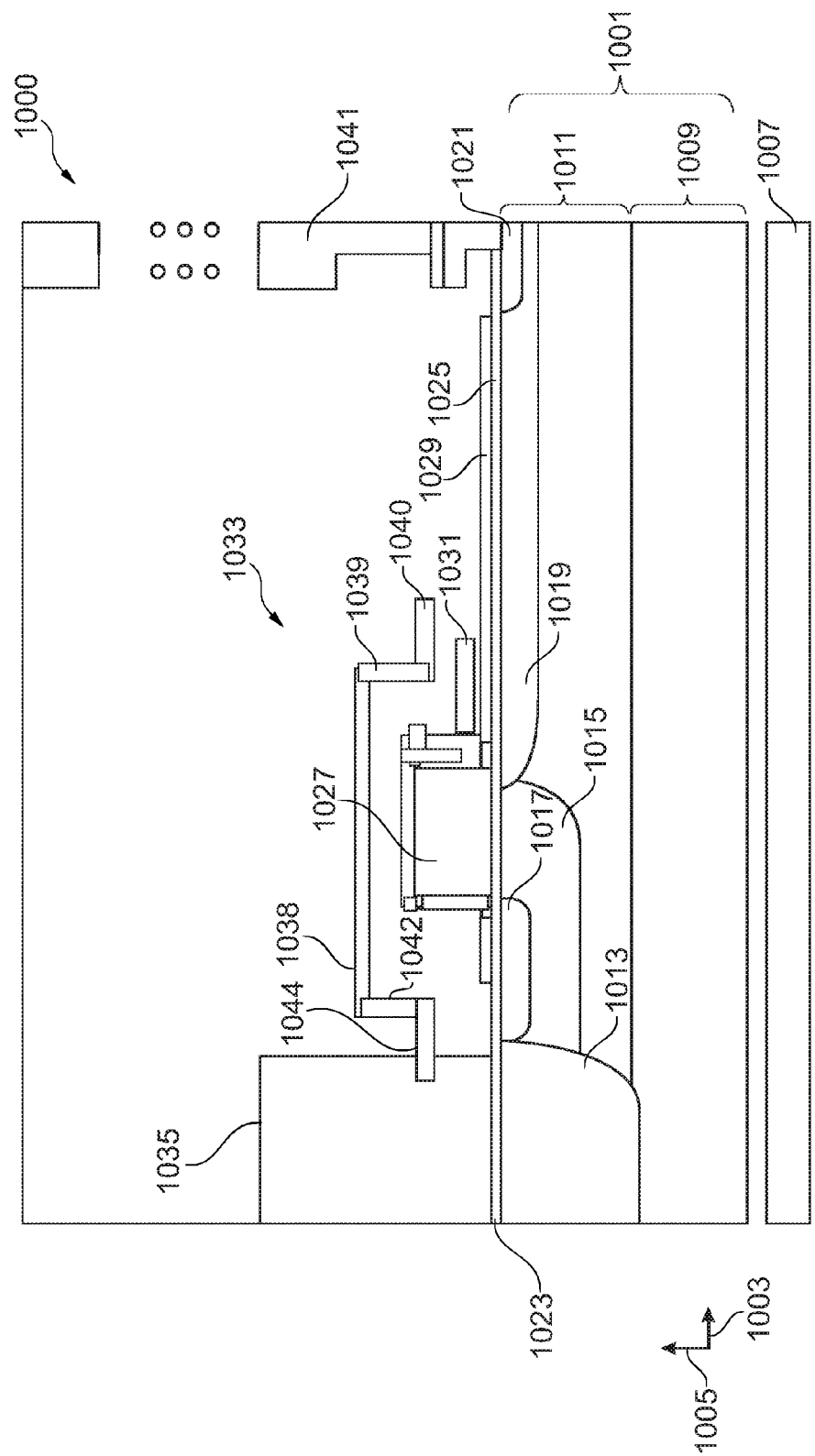
FIG. 10 is a cross-sectional view of a still further embodiment of a semiconductor transistor.

FIG. 10 is a sectional view of a LDMOS 1000 according to an embodiment. In the illustrated embodiment the second electrically conductive shield element 1033 covers the gate electrode 1027 and also protrudes in the horizontal direction 1003 over the first electrically conductive shield element 1031. Thereby, a combined effect of the embodiments 800 and 900, as illustrated in FIGS. 8 and 9, is achieved.

Figure 11:
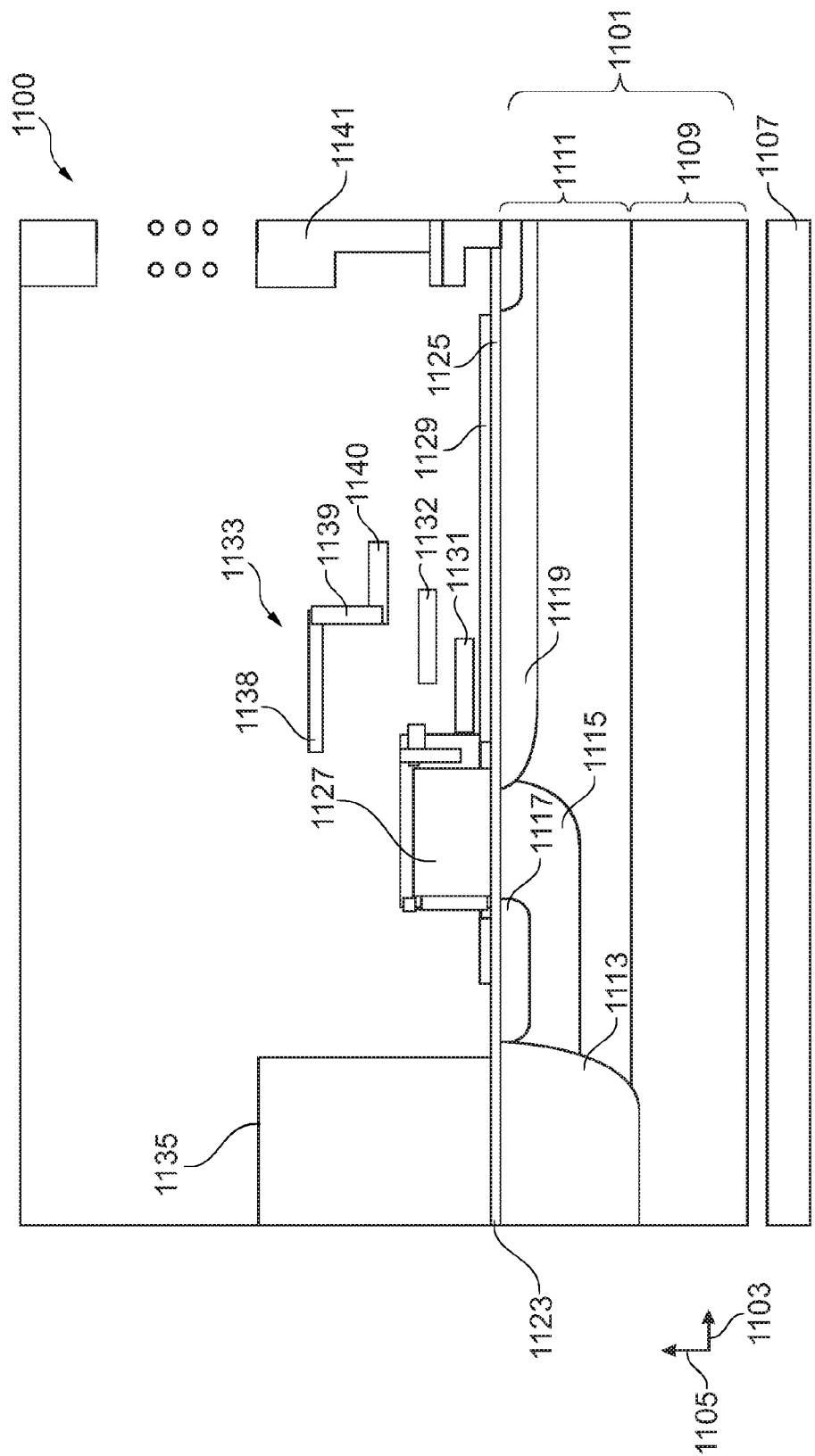
FIG. 11 is a cross-sectional view of a still further embodiment of a semiconductor transistor.
Figure 12:
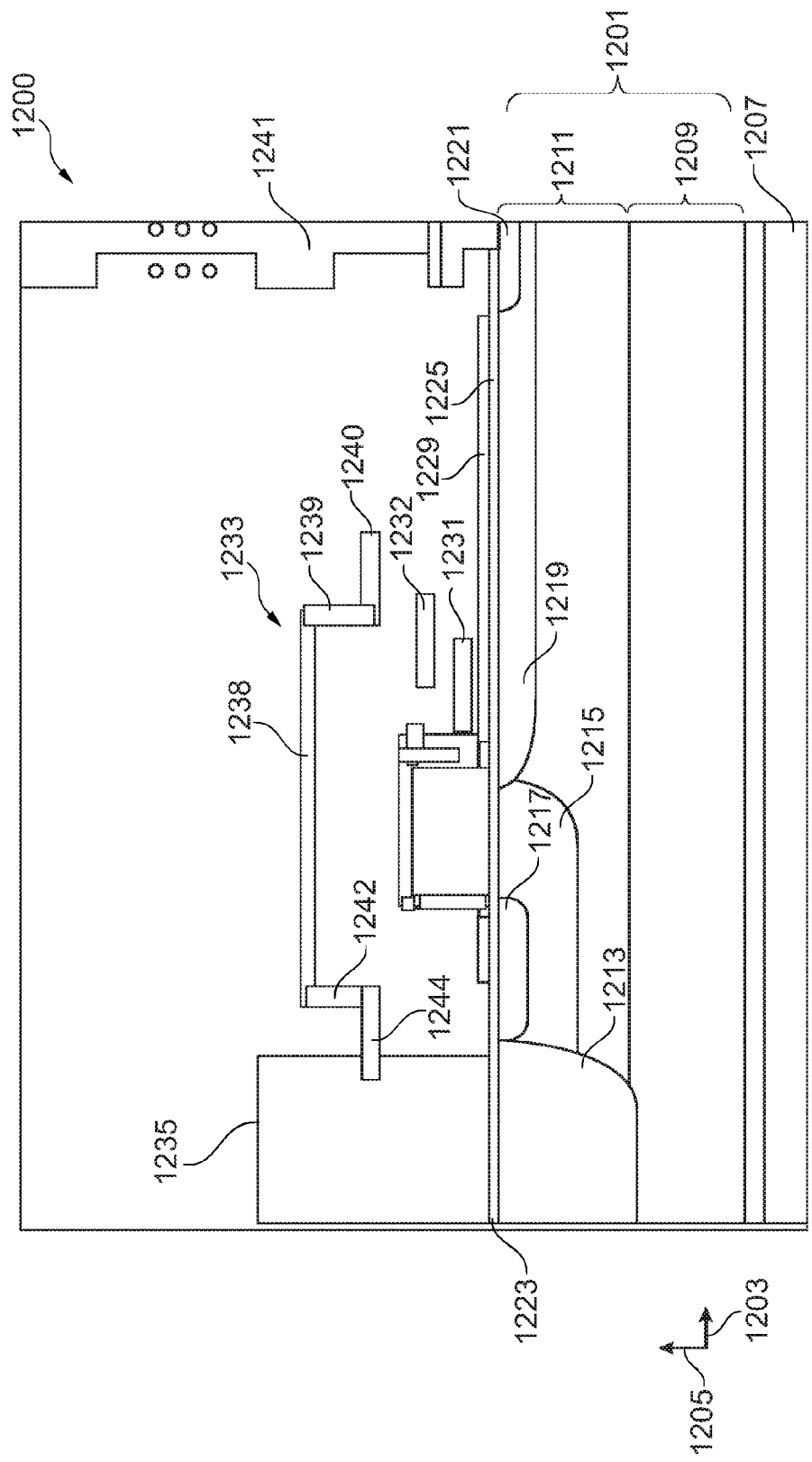
FIG. 12 is a cross-sectional view of a still further embodiment of a semiconductor transistor.

FIGS. 11 and 12 show cross-sectional views of an LDMOS 1100 and a LDMOS 1200 according to embodiments. Herein, the LDMOS 1100 and LDMOS 1200 each comprise a further first electrically conductive shield element 1132 and 1232, respectively, which are arranged vertically between the first electrically conductive shield element 1131 and 1231, respectively, and the second electrically conductive shield element 1133 and 1233, respectively. Thereby, the input capacitance is further reduced by using the second electrically conductive shield element 1133 and 1233, respectively, as a shielding plate.

Alternatively the backend metal layers at the drain 141 may be used as a shield.

It should be understood that individual features comprised in the illustrated embodiments may be used individually or in combination with any other disclosed features of other embodiments.

REFERENCE SIGNS

100 LDMOS
103 Horizontal direction
105 Vertical direction
107 Backside metallization
109 Substrate portion
111 Epitaxial substrate portion
101 Substrate
113 P-sinker
115 Channel region
117 Source region
119 Drain extension region
121 Drain region
125 Oxide layer
127 Gate electrode
123 Interconnection
129 Plasma oxide layer
131 First electrically conductive shield element
133 Second electrically conductive shield element
135 Source electrode
137 Shield connected bridge
138 First horizontal portion of the second electrically conductive shield element
139 Vertical portion of the second electrically conductive shield element
140 Second horizontal portion of the second electrically conductive shield element
141 Drain electrode
343 Contact via
145 Input capacitance
147 Input capacitance portion of the shield elements
149 Feedback capacitance
151 Input capacitance of LDMOS 100
153 Input capacitance of conventional LDMOS
155 Feedback capacitance of LDMOS 100
157 Feedback capacitance of conventional LDMOS
161,163,159 Source-drain current

The invention claimed is:

1. A semiconductor transistor, comprising:
a semiconductor substrate having a channel region and a drain extension region connected to the channel region, and a main surface;
a gate electrode configured to provide an electric field for influencing the channel region;
a first electrically conductive shield element extending in a horizontal direction parallel to the main surface of the semiconductor substrate and being arranged beside the gate electrode spaced apart from the drain extension region in a vertical direction perpendicular to the horizontal direction; and
a second electrically conductive shield element arranged spaced apart from the first shield element in the vertical direction;
wherein at least a portion of the gate electrode protrudes over the first shield element in the vertical direction;
wherein the second shield element includes a lower horizontal portion of the second shield element extending in the horizontal direction, a vertical portion of the second shield element extending in the vertical direction, an end of the vertical portion being connected to the lower horizontal portion of the second shield element, and an upper horizontal portion of the second shield element extending in the horizontal direction and being connected to another end of the vertical portion of the second shield element;
wherein a portion of the upper horizontal portion of the second shield element protrudes in the horizontal direction over an side edge of the gate electrode closest to the first shield element;
wherein the portion of the upper horizontal portion of the second shield element protrudes in the horizontal direction over the side edge of the gate electrode closest to the first shield element by an amount between 0.1 and 0.8 times an extent of an upper surface of the gate electrode in the horizontal direction.

2. The semiconductor transistor according to claim 1, wherein at least the portion of the gate electrode protrudes over the first shield element in the vertical direction by more than 1.1 times an extent of the first shield element in the vertical direction.

3. The semiconductor transistor according to claim 1, wherein a distance between the first shield element and the gate electrode in the horizontal direction is smaller than 0.3 μm.

4. The semiconductor transistor according to claim 1, wherein a distance between the first shield element and the drain extension region in the vertical direction is between 50 nm and 200 nm.

5. The semiconductor transistor according claim 1, wherein a distance between an upper surface of the first shield element and a lower surface portion of the second shield element is between 200 nm and 500 nm.

6. The semiconductor transistor according to claim 1, wherein a distance between an upper surface of the gate electrode and a lower surface of the upper horizontal portion of the second shield element is between 200 nm and 500 nm.

7. The semiconductor transistor according to claim 6, wherein a distance between an edge of the first shield element closest to the gate electrode and an edge of the vertical portion of the second shield element closest to the gate electrode is between 200 nm and 500 nm.

8. The semiconductor transistor according to claim 1, wherein the second shield element surrounds an upper surface of the gate electrode.

9. The semiconductor transistor according to claim 1, wherein the second shield element comprises a stair case shield partly protruding in the horizontal direction over a side edge of the first shield element farthest from the gate electrode.

10. The semiconductor transistor according to claim 1, further comprising a further first electrically conductive shield element extending in the horizontal direction and being arranged vertically between the first shield element and the second shield element, the further first electrically conductive shield element being spaced apart farther from the gate electrode than the first shield element.

11. The semiconductor transistor according to claim 1, further comprising
a source region provided in the semiconductor substrate and connected to the channel region and
a source electrode connected to the source region,
wherein at least one of the first shield element and the second field element is connected to the source electrode.

12. The semiconductor transistor according to claim 1, wherein the semiconductor substrate comprises at least one of Si, GaN, GaAs, AlGaN, SiC and AlN.

13. The semiconductor transistor according to claim 1, further comprising an oxide layer arranged on the channel region and on the drain extension region and arranged below the gate electrode and below the first shield element.

14. The semiconductor transistor according to claim 13, configured as LDMOS.

15. A semiconductor transistor, comprising:
a semiconductor substrate having a channel region and a drain extension region connected to the channel region, and a main surface;
a gate electrode configured to provide an electric field for influencing the channel region;
a first electrically conductive shield element extending in a horizontal direction parallel to the main surface of the semiconductor substrate and being arranged beside the gate electrode spaced apart from the drain extension region in a vertical direction perpendicular to the horizontal direction; and
a second electrically conductive shield element arranged spaced apart from the first shield element in the vertical direction;
wherein at least a portion of the gate electrode protrudes over the first shield element in the vertical direction;
wherein the second shield element includes a lower horizontal portion of the second shield element extending in the horizontal direction, a vertical portion of the second shield element extending in the vertical direction, an end of the vertical portion being connected to the lower horizontal portion of the second shield element, and an upper horizontal portion of the second shield element extending in the horizontal direction and being connected to another end of the vertical portion of the second shield element;
wherein a distance between an upper surface of the gate electrode and a lower surface of the upper horizontal portion of the second shield element is between 200 nm and 500 nm;
wherein a portion of the upper horizontal portion of the second shield element protrudes in the horizontal direction over a side edge of the gate electrode closest to the first shield element; and
wherein the portion of the upper horizontal portion of the second shield element protrudes in the horizontal direction over the side edge of the gate electrode closest to the first shield element by an amount between 0.1 and 0.8 times an extent of an upper surface of the gate electrode in the horizontal direction.

* * * * *